(12) United States Patent
Cai et al.

(10) Patent No.: US 8,149,147 B2
(45) Date of Patent: Apr. 3, 2012

(54) DETECTING AND REORDERING FIXED-LENGTH RECORDS TO FACILITATE COMPRESSION

(75) Inventors: Hua Cai, Hangzhou (CN); Jiang Li, Beijing (CN)

(73) Assignee: Microsoft Corporation, Redmond, WA (US)

( * ) Notice: Subject to any disclaimer, the term of this patent is extended or adjusted under 35 U.S.C. 154(b) by 602 days.

(21) Appl. No.: 12/346,506

(22) Filed: Dec. 30, 2008

(65) Prior Publication Data

US 2010/0169335 A1 Jul. 1, 2010

(51) Int. Cl.
*H03M 7/46* (2006.01)

(52) U.S. Cl. .......... 341/63; 715/255; 715/234; 707/758; 707/802; 341/70

(58) Field of Classification Search ............... 341/60–70; 715/255, 256, 234, 249, 764; 707/758, 802, 707/999.1, 999.102, 999.001
See application file for complete search history.

(56) References Cited

U.S. PATENT DOCUMENTS

| | | | |
|---|---|---|---|
| 6,288,811 B1 * | 9/2001 | Jiang et al. ................ | 398/79 |
| 6,959,300 B1 | 10/2005 | Caldwell et al. | |
| 7,103,608 B1 | 9/2006 | Ozbutun et al. | |
| 7,143,046 B2 | 11/2006 | Babu et al. | |
| 7,146,053 B1 | 12/2006 | Rijavec et al. | |
| 7,412,104 B2 | 8/2008 | Talapov et al. | |
| 7,451,396 B2 * | 11/2008 | Storisteanu ................. | 715/256 |
| 7,512,610 B1 * | 3/2009 | Barabas et al. ............. | 1/1 |
| 7,664,109 B2 * | 2/2010 | Li ................................. | 370/392 |
| 7,783,655 B2 * | 8/2010 | Barabas et al. ............. | 707/758 |
| 2008/0071818 A1 | 3/2008 | Apanowicz et al. | |

OTHER PUBLICATIONS

Abel, "Record Preprocessing for Data Compression," retrieved on Dec. 1, 2008 at <<http://www.data-compression.info/JuergenAbel/Preprints/Abstract_Record_Preprocessing.pdf>>, IEEE Proceedings of Data Compression Conference, 2004, pp. 521.

Bateman et al., "The Pfam Protein Families Database," retrieved on Dec. 1, 2008 at <<http://citeseerx.ist.psu.edu/viewdoc/download-?doi=10.1.1.41.4109&rep=rep1&type=pdf>>, 16 pgs.

Blum et al., "Linear Approximation of Shortest Superstrings," retrieved on Dec. 1, 2008 at <<http://delivery.acm.org/10.1145/180000/179818/p630-blum.pdf?key1=179818&key2=1913028221&coll=GUIDE&dl=GUIDE&CFID=13521258&CFTOKEN=89281336>>, Journal of the ACM (JACM), vol. 41, No. 4, Jul. 1994, pp. 630-647.

Buchsbaum et al., "Engineering the Compression of Massive Tables: An Experimental Approach," retrieved on Dec. 1, 2008 at <<http://www.research.att.com/~gsf/publications/pzip-2000-1.pdf>>, ACM Society for Industrial and Applied Mathematics Symposium on Discrete Algorithms (SIAM), 2000, pp. 175-184.

Burrows et al., "A Block-Sorting Lossless Data Compression Algorithm," retrieved on Dec. 1, 2008 at <<http://citeseerx.ist.psu.edu/viewdoc/download;jsessionid=BCE94F41C66A151779C09583FBBCA595?doi=10.1.1.37.6774&rep=rep1&type=pdf>>, Digital Equipment Corporation, SRC Research Report 124, May 10, 1994, pp. 1-18.

"Census of population and housing, 1990: Summary tape file 3," U.S. Bureau of the Census, Washington D.C., 1992, 464 pgs.

(Continued)

*Primary Examiner* — Lam T Mai
(74) *Attorney, Agent, or Firm* — Lee & Hayes, PLLC

(57) ABSTRACT

Disclosed herein are one or more embodiments that facilitate compression of a source file having a fixed-length record therein. One or more of the disclosed embodiments detect the fixed-length records and determine a reordering plan for the source file, including determining a plurality of column groupings within the detected fixed-length records.

20 Claims, 6 Drawing Sheets

OTHER PUBLICATIONS

Charikar et al., "Improved Combinatorial Algorithms for the Facility Location and k-Median Problems," retrieved on Dec. 1, 2008 at <<http://citeseerx.ist.psu.edu/viewdoc/download?doi=10.1.1.38.9431&rep=rep1&type=pdf>>, IEEE Symposium on Foundations of Computer Science, Nov. 15, 1999, pp. 1-28.

Chudak et al., "Improved Approximation Algorithms for the Uncapacitated Facility Location Problem," School of Operations Research & Industrial Engineering and Department of Computer Science, Cornell University, New York, 1998, 19 pgs.

Chudak et al., "Improved Approximation Algorithms for Uncapacitated Facility Location," retrieved on Dec. 1, 2008 at <<http://citeseerx.ist.psu.edu/viewdoc/download?doi=10.1.1.56.654&rep=rep1&type=pdf>>, Society for Industrial and Applied Mathematics Journal on Computing, vol. 33, No. 1, 2004, pp. 1-25.

Cirasella et al., "The Asymmetric Traveling Salesman Problem: Algorithms, Instance Generators, and Tests," retrieved on Dec. 1, 2008 at <<http://citeseerx.ist.psu.edu/viewdoc/download?doi=10.1.1.31.8634&rep=rep1&type=pdf>>, 2001, 22 pgs.

Cleary et al., "Data-Compression Using Adaptive Coding and Partial String Matching," retrieved on Dec. 2, 2008 at <<http://ieeexplore.ieee.org/stamp/stamp.jsp?arnumber=1096090&isnumber=23982>>, IEEE Transactions on Communications, vol. 32, No. 4, 1984, pp. 396-402.

Cormack, "Data Compression on a DataBase System," retrieved on Dec. 1, 2008 at <<http://delivery.acm.org/10.1145/220000/214963/p1336-cormack.pdf?key1=214963&key2=7453028221&coll=GUIDE&dl=GUIDE&CFID=13521944&CFTOKEN=65534161>>, Communications of the ACM, vol. 28, No. 12, Dec. 1985, pp. 1336-1342.

Cover et al., "Elements of Information Theory," John Wiley and Sons, Inc., New York, 1991, pp. vii—542.

Davisson, "Universal Noiseless Coding," IEEE Transactions on Information Theory, vol. 19, Nov. 6, 1973, pp. 783-795.

Goldstein et al., "Compressing Relations and Indexes," retrieved on Dec. 1, 2008 at <<http://www.cs.brown.edu/courses/cs227/Papers/Compression/Ramakrishnan.pdf>>, IEEE International Conference on Data Engineering (ICDE), 1998, pp. 370-379.

Grumbach et al., "A New Challenge for Compression Algorithms: Genetic Sequences," retrieved on Dec. 1, 2008 at <<http://citeseerx.ist.psu.edu/viewdoc/download?doi=10.1.1.32.7578&rep=rep1&type=pdf>>, Pergamon Press, Inc, Tarrytown, NY, International Journal of Information Processing and Management, vol. 30, No. 6, 1994, pp. 875-886.

Held et al. "The Traveling Salesman Problem and Minimum Spanning Trees: Part II," Mathematical Programming, vol. 1, No. 1, pp. 6-25, 1971, pp. 6-25.

Held et al., "The Traveling-Salesman Problem and Minimum Spanning Trees," retrieved on Dec. 1, 2008 at <<http://www.cse.wustl.edu/~chen/7102/Karp-TSP.pdf>>, Institute for Operations Research (INFORMS), vol. 18, No. 6, 1970, pp. 1138-1162.

Huffman, "A Method for the Construction of Minimum Redundancy Codes," retrieved on Dec. 1, 2008 at <<http://compression.ru/download/articles/huff/huffman_1952_minimum-redundancy-codes.pdf>>, Proceedings of the IRE, vol. 40, No. 9, 1952, pp. 1098-1101.

Hunt et al., "An Empirical Study of Delta Algorithms," IEEE Software Configuration and Maintenance Wks., 1996, pp. 49-66.

Jain et al., "Primal-Dual Approximation Algorithms for Metric Facility Location and k-Median Problems," retrieved on Dec. 1, 2008 at <<http://citeseerx.ist.psu.edu/viewdoc/download?doi=10.1.1.46.6974&rep=rep1&type=pdf>>, IEEE Computer Society, Symposium on Foundations of Computer Science, 1999, pp. 2-13.

Jelinek et al., "On Variable-Length-to-Block Coding," retrieved on Dec. 1, 2008 at <<http://ieeexplore.ieee.org/stamp/stamp.jsp?arnumber=01054899>>, IEEE Transactions on Information Theory, vol. 18, No. 6, 1972, pp. 765-774.

Juang et al., "Distortion Performance of Vector Quantization for LPC Voice Coding," retrieved on Dec. 2, 2008 at <<http://ieeexplore.ieee.org/stamp/stamp.jsp?arnumber=1163866&isnumber=26169>>, IEEE Transactions on Acoustics, Speech and Signal Processing, vol. 30, No. 2, 1982, pp. 294-304.

Karp, "Minimum-Redundancy Coding for the Discrete Noiseless Channel," retrieved on Dec. 1, 2008 at <<http://ieeexplore.ieee.org/stamp/stamp.jsp?arnumber=1057615&isnumber=22782>>, IRE Transactions on Information Theory, vol. 7, No. 1, 1961, pp. 27-38.

Kobler et al., "Architecture and Design of Storage and Data Management for the NASA Earth Observing System Data and Information System (EOSDIS)," retrieved on Dec. 1, 2008 at <<http://ieeexplore.ieee.org/stamp/stamp.jsp?arnumber=528217&isnumber=11538>>, IEEE Computer Society Symposium on Mass Storage Systems, 1995, pp. 65-76.

Korupolu et al., "Analysis of a Local Heuristic for Facility Location Problems," retrieved on Dec. 1, 2008 at <<http://citeseerx.ist.psu.edu/viewdoc/download?doi=10.1.1.38.8910&rep=rep1&type=pdf>>, ACM Society for Industrial and Applied Mathematics Symposium on Discrete Algorithms (SIAM), DIMACS Technical Report 98-30, 1998, pp. 1-37.

Kosaraju et al., "Compression of Low Entropy Strings with Lempel-Ziv Algorithms," SIAM J. Comp., 1999, vol. 29, No. 3, pp. 893-911.

Lanave et al., "Update of AMmtDB: A Database of Multi-aligned Metazoa Mitochondrial DNA Sequences," Nucleic Acids Research, 2000, vol. 28, No. 1, pp. 153-154.

Lempel, et al., "An Algorithm for Optimal Prefix Parsing of a Noiseless and Memoryless Channel", retrieved on Dec. 1, 2008 at <<http://ieeexplore.ieee.org/stamp/stamp.jsp?arnumber=01054981>>, IEEE Transactions on Information Theory, vol. 19, No. 2, 1973, pp. 208-214.

Lempel et al., "On the Complexity of Finite Sequences," retrieved on Dec. 1, 2008 at <<http://ieeexplore.ieee.org/stamp/stamp.jsp?arnumber=1055501&isnumber=22688>>, IEEE Transactions on Information Theory, vol. 22, No. 1, 1976, pp. 75-81.

Mahoney, "PAQ4 archiver—Interactive Code," retrieved on Dec. 2, 2008 at <<http://www.interactivecode.com/compression-6/paq4-archiver-19867/>>, 2003, pp. 1-6.

Markel et al., "Linear Prediction of Speech," Springer-Verlag, 1976.

Moffat, "Implementing the PPM Data-Compression Scheme," retrieved on Dec. 1, 2008 at <<http://ieeexplore.ieee.org/stamp/stamp.jsp?arnumber=00061469>>, IEEE Transactions on Communications, vol. 38, No. 11, 1990, pp. 1917-1921.

Nevill-Manning et al., "Protein is Incompressible," retrieved on Dec. 1, 2008 at <<http://www.cs.waikato.ac.nz/~ihw/papers/99CN-IHW-Proteincompressibl.pdf>>, IEEE Computer Society Data Compression Conference (DCC), 1999, pp. 257-265.

Papadimitriou et al, "The Travelling Salesman Problem with Distances One and Two," Mathematics of Operations Research. vol. 18, No. 1, 1993, pp. 1-11.

Perl et al., "Efficient Generation of Optimal Prefix Code: Equiprobable Words Using Unequal Cost Letters," retrieved on Dec. 1, 2008 at <<http://portal.acm.org/citation.cfm?doid=321879.321883>>, Journal of the ACM (JACM), vol. 22, No. 2, 1975, pp. 202-214.

Shmoys et al., "Approximation Algorithms for Facility Location Problems," In the Proceedings of the 29th Annual ACM Symposium on Theory of Computing, 1997, pp. 265-274.

Skibinski, "Two-Level Directory based Compression," retrieved on Dec. 1, 2008 at <<http://www.ii.uni.wroc.pl/~inikep/papers/05-TwoLevelDict.pdf>>, IEEE Computer Society, Data Compression Conference (DCC), 2005, pp. 481-492.

Varn, "Optimal Variable Length Codes," Information and Control, vol. 19, Issue 4, Nov. 1971, pp. 289-301.

Welch, "A Technique for High-Performance Data Compression," retrieved on Dec. 1, 2008 at <<http://www.cs.duke.edu/courses/spring03/cps296.5/papers/welch_1984_technique_for.pdf>>, IEEE Computer Society Press, Computer, vol. 17, No. 6, 1984, pp. 8-19.

Witten et al., "Arithmetic Coding for Data Compression," retrieved on Dec. 1, 2008 at <<http://delivery.acm.org/10.1145/220000/214771/p520-witten.pdf?key1=214771&key2=5194128221&coll=GUIDE&dl=GUIDE&CFID=13542278&CFTOKEN=59097927>>, Communications of the ACM, vol. 30, No. 6, 1987, pp. 520-540.

Zhang, "Truncated Branch-and-Bound: A Case Study on the Asymmetric TSP," Proc. AAAI-93 Spring Symp. on AI and NP-Hard Problems, Standard, CA, Mar. 23-25, 1993, pp. 160-166.

Ziv et al., "A Universal Algorithm for Sequential Data Compression," retrieved on Dec. 1, 2008 at <<http://ieeexplore.ieee.org/stamp/stamp.jsp?arnumber=01055714>>, IEEE Transactions on Information Theory, vol. 23, No. 3, 1977, pp. 337-343.

Ziv, "Coding of Sources with Unknown Statistics—Part 1: Probability of Encoding Error," retrieved on Dec. 1, 2008 at <<http://ieeexplore.ieee.org/stamp/stamp.jsp?arnumber=01054830>>, IEEE Transactions on Information Theory, vol. 18, No. 3, 1972, pp. 384-389.

Ziv et al., "Compression of Individual Sequences via Variable-Rate Coding," retrieved on Dec. 1, 2008 at <<http://www.cs.duke.edu/courses/spring03/cps296.5/papers/ziv_lempel_1978_variable-rate.pdf>>, IEEE Transactions on Information Theory, vol. 24, No. 5, 1978, pp. 530-536.

* cited by examiner

Find string pattern satisfying $p_1-p_2=p_2-p_3$
$n = p_1-p_2$
$mb_1 = CalMatch(p_1, p_2, n)$
$mb_2 = CalMatch(p_2, p_3, n)$
if $(mb_1 <= n/t)$ and $(mb_2 <= n/t)$
   m=3
   pointer= $p_1+n$
   while $CalMatch(pointer, pointer-n, n) <= n/t$
     m++
     pointer=pointer+n
   end while
end if

Fig. 2

$I_0 = \{C[0]\}$, i=0
For j=0 to n-2
   if $C[j]$ and $C[j+1]$ are dependent
     Merge $C[j+1]$ into $I_i$
   else
     ++i
     $I_i=\{C[j+1]\}$
   end if
end for

Fig. 3

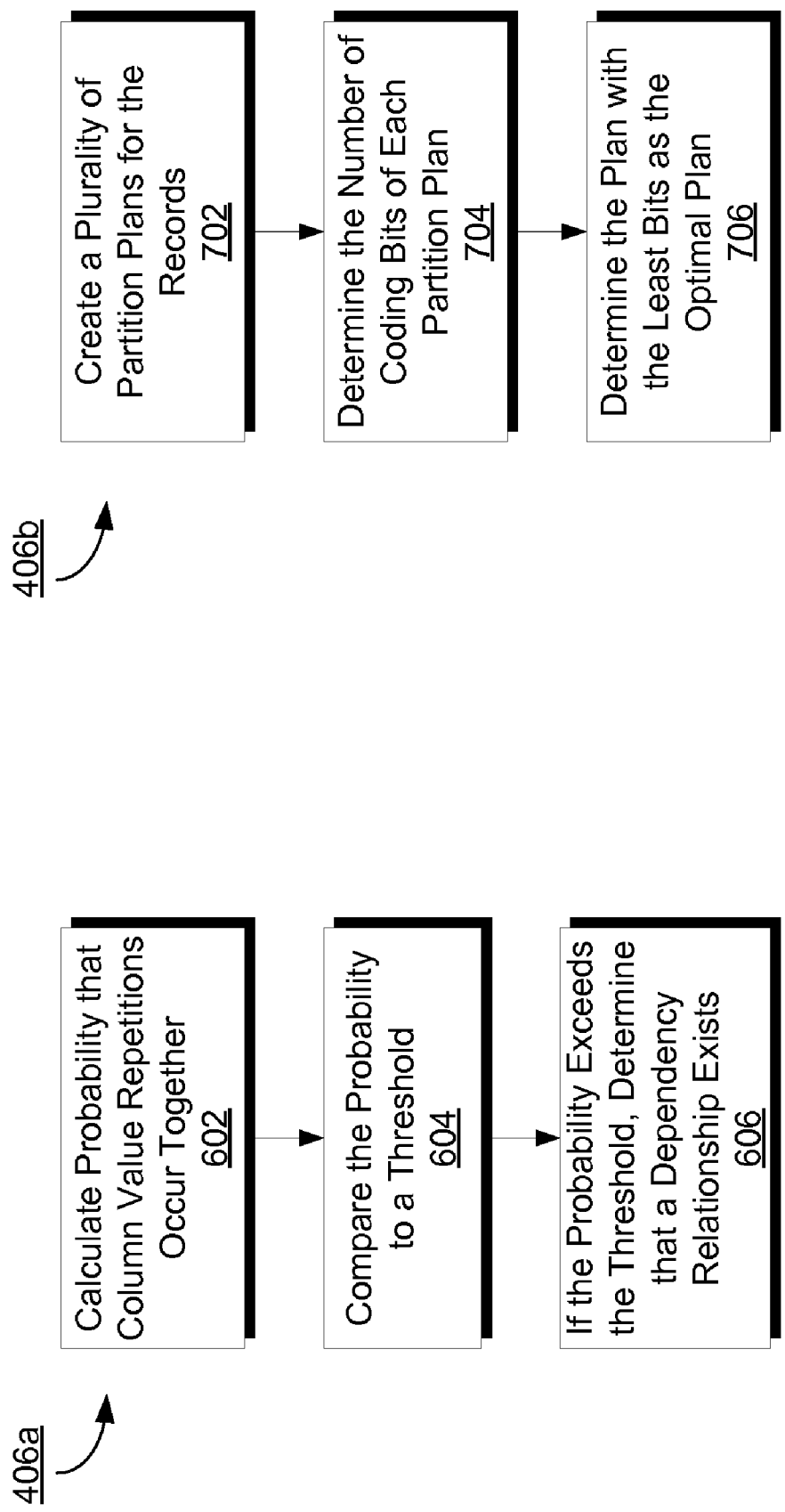

DETECTING AND REORDERING FIXED-LENGTH RECORDS TO FACILITATE COMPRESSION

BACKGROUND

With the wide adoption of communication networks, such as the Internet, efficient transmission and reception of large data files is increasingly important. To reduce the time and bandwidth for communicating such files, compression and decompression are often used. Compression utilities, such as WinZip™ or GZip™ are used to transform data files to Zip files, Zip being a popular data compression format. Compression also involves the use of a number of well-known compression algorithms, such as the Lempel-Ziv algorithm, which remove repeated data from a compressed file.

To achieve better compression results, compression tools often utilize knowledge of the structure of the to-be-compressed files and of the types of data in the to-be-compressed files. This knowledge is often provided in an associated file called a schema. Many to-be-compressed files, however, are not associated with any sort of schema. These sans-schema to-be-compressed files often are quite complex and include numerous types of data, such as tables, text, and images. Without access to a schema, compression tools attempting to compress such complex to-be-compressed files achieve less desirable compression results.

SUMMARY

In various embodiments, a computing device is configured to facilitate compression of a source file. This computing device may detect a plurality of fixed-length records within the source file. The computing device may further determine a reordering plan for the source file, including determining a plurality of column groupings within the detected fixed-length records. Also, in some embodiments, the computing device may reorder the fixed-length records based on the reordering plan to facilitate compression of the source file.

Additionally, the detecting performed by the computing device may further comprise determining a plurality of candidate records based on a repeating string pattern detected within the source file. The computing device may then determine a candidate record length based on a byte differential between repeated instances of the string pattern and compare first byte values occurring between the repeated instances of the string pattern with second byte values following the first byte values by the record length in order to calculate a score. If the score is less than or equal to a threshold value, the computing device may determine that the candidate records are members of the set of fixed-length records.

Further, in some embodiments, the determining of column groupings performed by the computing device may comprise determining a dependency relationship between a first column and a second column based on a tendency of values repeating in the first column to appear together with values repeating in the second column. In other embodiments, the determining of column groupings may comprise determining a partition plan of a set of partition plans partitioning the fixed-length records into candidate column groupings as an optimal partition plan based on coding bit sizes associated with each partition plan.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DESCRIPTION OF DRAWINGS

Non-limiting and non-exhaustive examples are described with reference to the following figures:

FIG. 2 is an exemplary portion of pseudo-code associated with detecting fixed-length records, in accordance with various embodiments;

FIG. 3 is an exemplary portion of pseudo-code associated with determining a dependency relationship between columns, in accordance with various embodiments;

FIG. 6 is a flowchart view of exemplary operation association with determining a dependency relationship between columns, in accordance with various embodiments;

FIG. 7 is a flowchart view of exemplary operation association with determining an optimal partition plan, in accordance with various embodiments.

DETAILED DESCRIPTION

Overview

Figure 1:
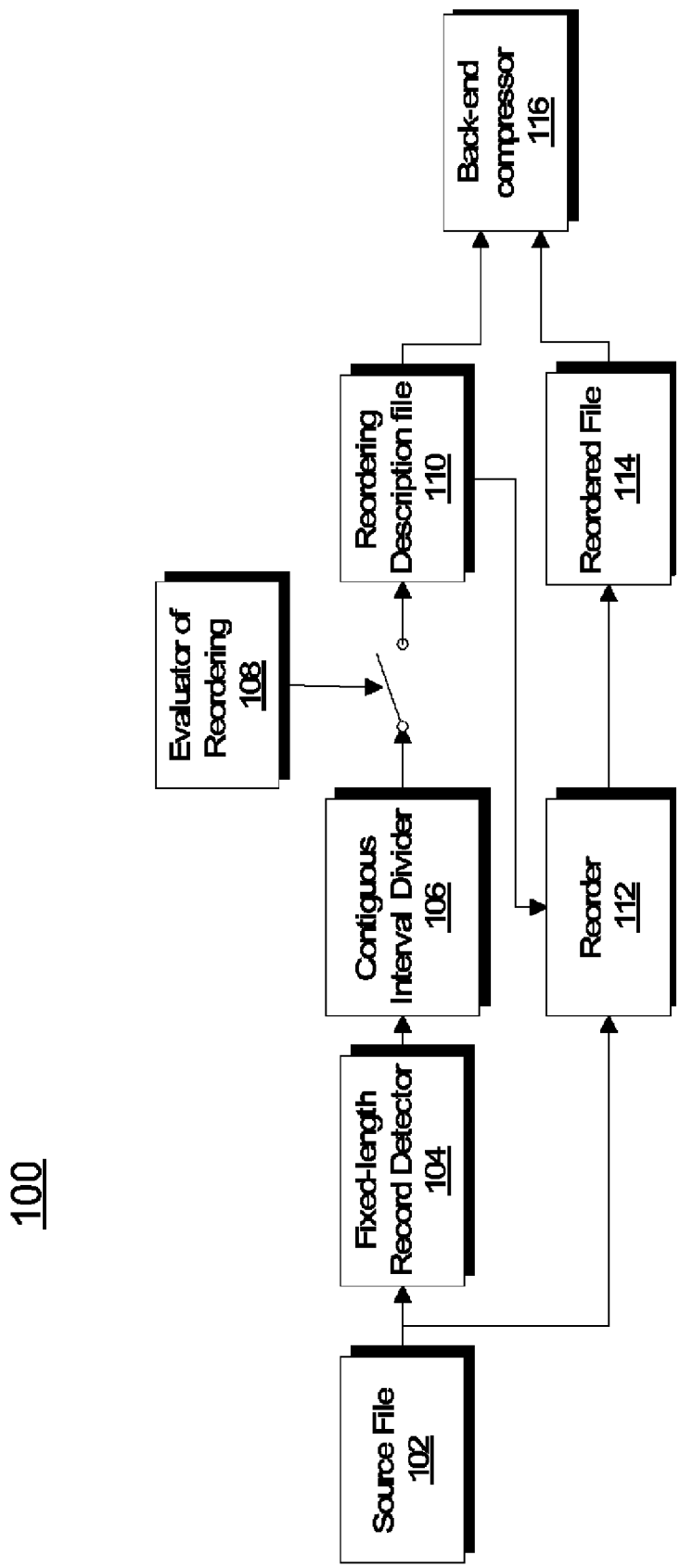
FIG. 1 is a block diagram illustrating an overview in accordance with various embodiments.

FIG. 1 is a block diagram illustrating an overview in accordance with various embodiments. More specifically, FIG. 1 shows blocks representing data, operations, and logical components to illustrate the flow of data from receipt of a source file 102 to compression of a reordered file 114 and a reordering description file 110 by a back-end compressor 116.

As shown, the source file 102 may first be analyzed by a fixed-length record detector 104. After analysis by the fixed-length record detector 104, the contiguous interval divider 106 may then receive and process by source file 102. An evaluator of reordering 108 may then analyze a reordering plan generated by the contiguous interval divider 106. In response to determining that reordering is appropriate, the evaluator of reordering 108 may then enable the generation of a reordering description file 110 and the reordering 112 of source file 102 to generate a reordered source file 114. A back-end compressor 116 may then compress the reordering description file 110 and reordered source file 114.

Figure 8:
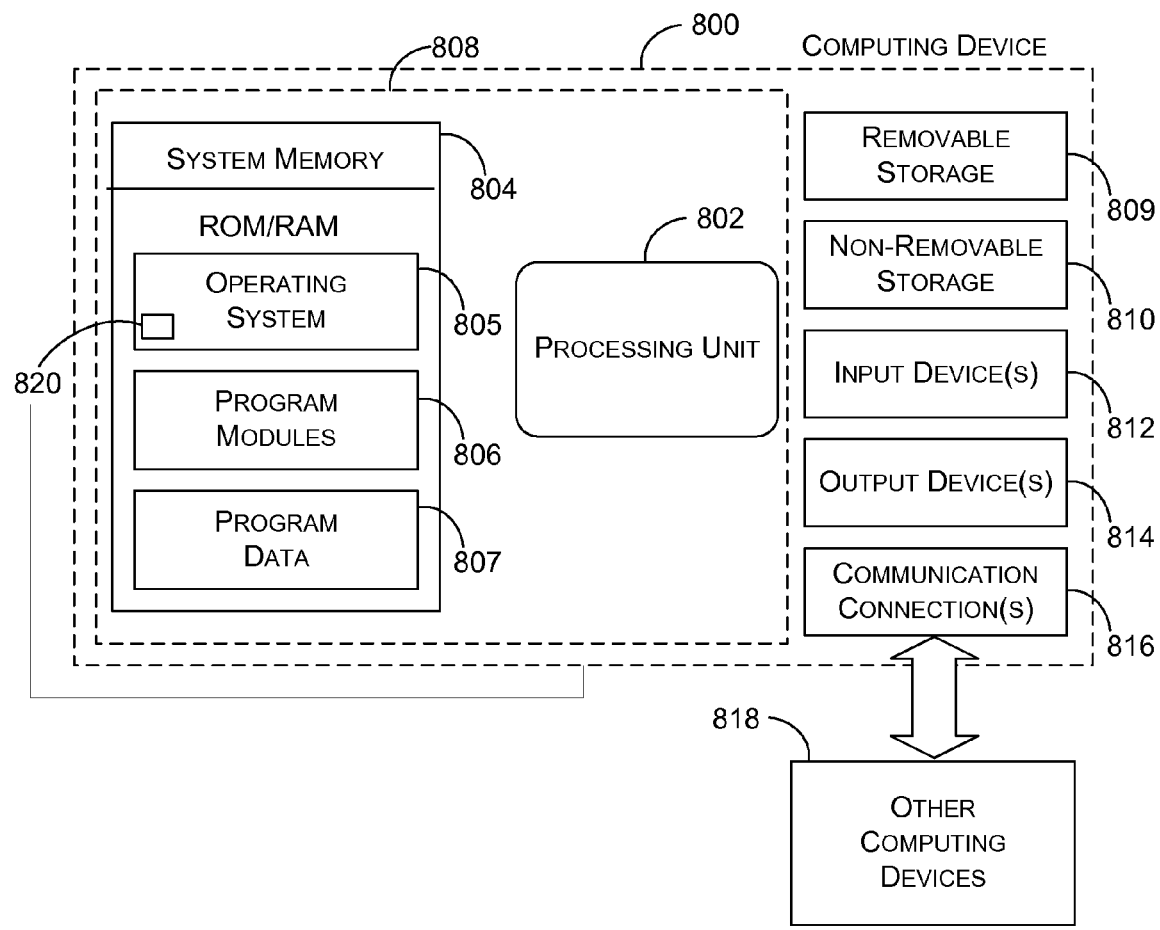
FIG. 8 is a block diagram of an exemplary computing device.

In various embodiments, the operations, logical components, and files illustrated by FIG. 1 may be performed by and/or reside on one or more computing devices (not shown). The one or more computing devices may be any sort of computing devices known in the art, such as personal computers (PCs), laptops, servers, phones, personal digital assistants (PDAs), set-top boxes, and data centers. The computing devices may be single- or multi-processor devices. In some embodiments, one or more of the computing devices may be a virtual machine operating on another, physical computing device. Also, the one or more computing devices may be particular machines configured to facilitate compression and to perform some or all of the operations described above and below. FIG. 8 and its corresponding description below illustrate any exemplary computing device of the one or more computing devices in greater detail.

Also, in some embodiments, when the operations, logical components, and files illustrated by FIG. 1 may be performed by and/or reside on at least two computing devices, those computing devices may be connected by at least one networking fabric (not shown). For example, the computing devices may be connected by a local access network (LAN), a public or private wide area network (WAN), and/or by the Internet. In some embodiments, the computing devices may implement between themselves a virtual private network (VPN) to secure the communications. Also, the computing devices may utilize any communications protocol known in the art, such as the Transmission Control Protocol/Internet Protocol (TCP/IP) set of protocols. In other embodiments, rather than being coupled by a networking fabric, the computing devices may be locally or physically coupled.

As illustrated, the one or more computing devices may receive or retrieve a source file 102. In various embodiments, the source file 102 may be, for example, a database file, a text file, a word processing document, a spreadsheet, or a presentation file. However, the source file 102 may be any sort of file known in the art which may include one or more fixed-length tables. In some embodiments, the source file 102 may include both table data and non-table data. The source file 102 may have been stored on one of the computing devices or may have been received from another computing device. In some embodiments, the source file 102 is retrieved from local storage, retrieved from remote storage, or received through a storage medium (such as a compact disc (CD) or thumb drive) or signal.

As shown in FIG. 1, the fixed-length record detector 104 may be any set of executable instructions to configure the one or more computing devices to automatically detect fixed-length records of the one or more fixed-length tables included in the source file 102.

The fixed-length record detector 104 (hereinafter "detector 104") may process the source file 102 in a single pass, comparing bytes of the source file 102 over a pre-determined interval of the source file 102. For example, the pre-determined interval may be 50 bytes in length, and detector 104 may process the source file 102 over that 50 byte interval to detect any byte in the interval which repeats more than once. Once two or more matching bytes are detected, the detector 104 may determine the byte length between the matching bytes as a candidate record length. For example, if three bytes at positions $p_1$, $p_2$ and $p_3$ are detected, a candidate record length of n may be calculated as follows:

$$p_1 - p_2 = p_2 - p_3 = n$$

The matching bytes and candidate record length may be considered evidence of three candidate n-byte length records beginning at positions $p_1$, $p_2$ and $p_3$, respectively. While the actual records may begin at different byte positions (in other words, the matching byte may be at the middle of a record rather than its beginning), detection of the positions at which matching bytes repeat and calculation of the record length allow the detector 104 to determine which bytes belong to which columns of the records, allowing the columns to be separated into column groupings.

In various embodiments, detector 104 may then confirm whether the candidate records are fixed-length records by comparing matched bytes between the records (i.e., bytes in each record separated by the candidate record length). To perform the comparison, a function CalMatch( ) may be defined to calculate the matched bytes between two l-byte records that start at the positions $q_1$, $q_2$:

$$CalMatch(q_1, q_2, l) = \sum_{i=0}^{l-1} s_i$$

where $$S_i = \begin{cases} 0 & \text{if } q_1[i] = q_2[i] \\ 1 & \text{otherwise} \end{cases}$$

Continuing with the above example, if the candidate records satisfy:

$$CalMatch(p_1,p_2,n) \leq n/t, \text{ and } CalMatch(p_2,p_3,n) \leq n/t$$

where t is an experimentally determined, pre-defined value, the detector 104 may consider fixed-length records to be detected. In some embodiments, the pre-defined value t may range between 2 and 4. The detector 104 may then repeatedly check matched bytes between every following n bytes and their preceding n bytes until the result of function CalMatch( ) is larger than n/t.

Upon completion of processing source file 102 (or concurrently, while processing the file), the detector 104 may write the beginning position, record length, and number of records for each detected record group to a file or data structure. In some embodiments, the file or data structure may be the reordering description file 110, which may be created by detector 104. Continuing with the above example, detector 104 may write the beginning position $p_1$, the record length n, and the number of records (three) for the detected record group (and for any other detected record groups) to a file or data structure.

Additionally, FIG. 2 shows pseudocode for some of the above-described operations of the detector 104 for m records. As illustrated, the detector 104 may find repeating byte values, calculate a candidate record length, compare matched bytes between the candidate records to confirm the candidate records as records, and repeat the comparing until all m records are detected and confirmed.

Figure 5:
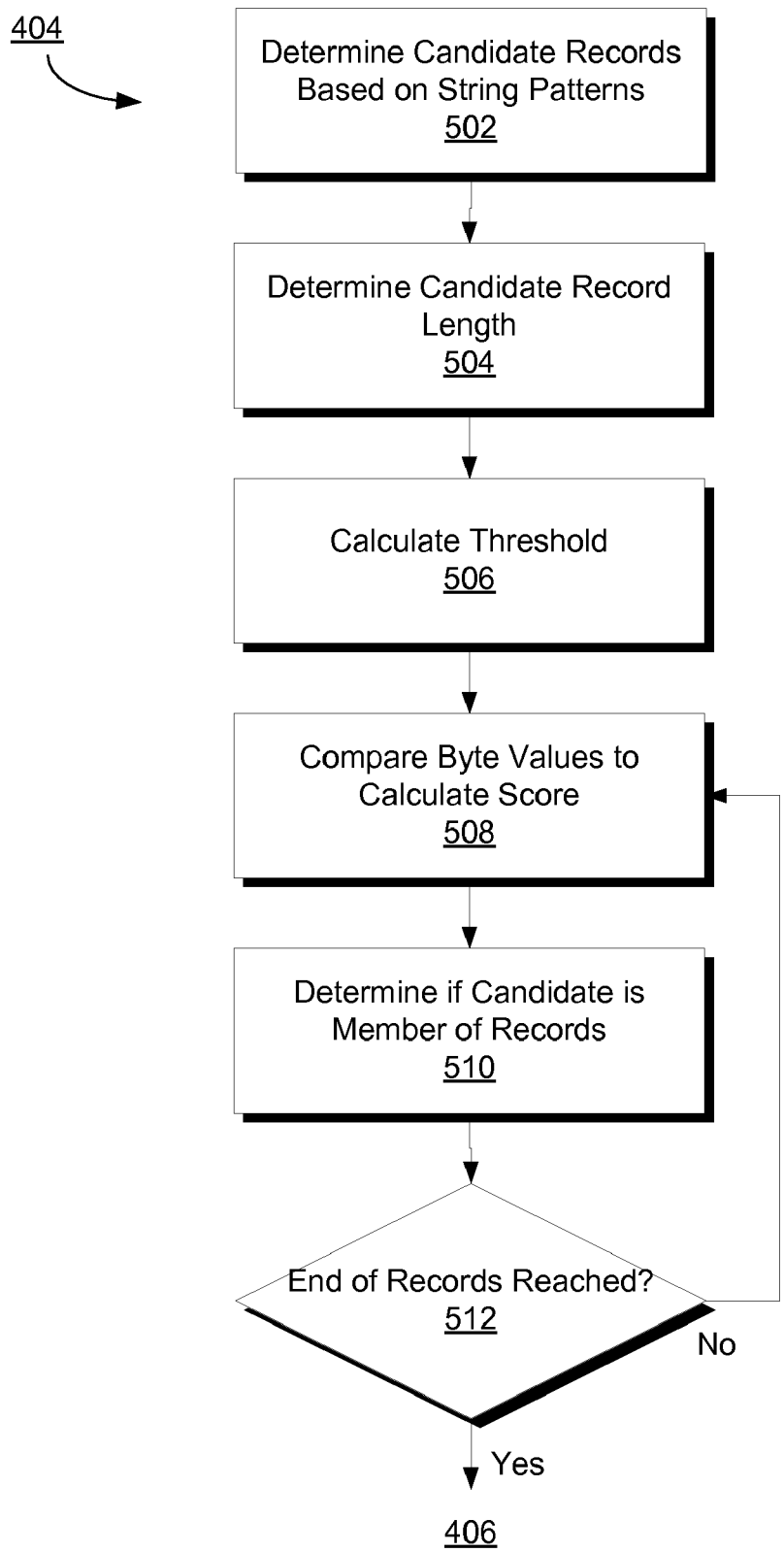
FIG. 5 is a flowchart view of exemplary operation association with detecting fixed-length records, in accordance with various embodiments.

Further, exemplary operations of the fixed-length record detector 104 are shown in FIG. 5 and described in greater detail below.

As is further illustrated in FIG. 1, the contiguous interval divider 106 may be any set of executable instructions to configure the one or more computing devices to generate a reordering plan and determine a plurality of column groupings within the fixed-length records for reordering. The reordering plan and column groupings may facilitate compression, in some embodiments. In various embodiments, the contiguous interval divider 106 (hereinafter "divider 106") may operate in at least one of two modes: a "fast" mode and/or a "dynamic programming" mode.

In the "fast" mode, the divider 106 may determine the column groupings and reordering plan by determining dependency relationships between first columns and second columns based on a tendency of values repeating in the first columns to appear together with values repeating in the second columns.

In various embodiments, the divider 106 may begin operating in the "fast" mode by initializing a first "interval"/column grouping for a first column of the detected fixed-length records. For example, for a set of intervals/column groupings $l_i$, where i is an index of a current processing interval, and for a set of columns C[J], where J is an index of a current processing column, $I_0 = \{C[0]\}$.

The divider 106 may then determine whether the current processing column and the column following it (C[J] and C[J+1]) are dependent. To determine whether the two columns are dependent, divider 106 may calculate a number of probabilities and compare those probabilities to a threshold. For example, let X denote the event that a byte in a column C[j] equals the byte in the same column but last row, and let Y denote the event that a byte in the column C[j+1] equals the byte in the same column but last row. Also, let P(X) and P(Y) be the statistical probabilities of the events X and Y. If the conditional probabilities P(X|Y)>δ and P(Y|X)>δ, where δ is a predefined threshold, the divider 106 may determine that a dependency relationship exists between columns C[J] and C[J+1]. In some embodiments, the threshold δ may be set to 0.95.

If the divider 106 determines that C[J] and C[J+1] are dependent, the divider 106 may merge C[J+1] into the current processing interval $I_i$. If not, the divider 106 may increment the index i of the current processing interval. Regardless of whether the columns are dependent, after adding the subsequent column C[J+1] or incrementing the index i, the divider 106 may increment the current processing column index J and repeat the above determination of dependency for the incremented $J^{th}$ column and the column subsequent to it. The divider 106 may perform these above operations in the "fast" mode for each column J from 0 to n−1 (n again referring to a record length).

Additionally, FIG. 3 shows pseudo code for some of the above-described operations of the divider 106 operating in "fast" mode. As illustrated, the divider 106 may, for each column, determine if there is a dependency relationship with the subsequent column and, if so, merge the subsequent column into the current interval.

In the "dynamic programming" mode, the divider 106 may determine a partition plan of a set of partition plans partitioning the fixed-length records into candidate column groupings as an optimal partition plan based on coding bit sizes associated with each partition plan.

In various embodiments, the divider 106 begins operating in the "dynamic" mode by generating a plurality of partition plans. The partition plans may each propose one specific set of intervals/column groupings of the detected fixed-length records. In one embodiment, there may be a partition plan for each and every possible set of column groupings. In other embodiments, divider 106 may propose a pre-determined number of column groupings. In one embodiment, the pre-determined column groupings may be generated randomly.

Once the partition plans are generated, the divider 106 may calculate the coding bit size of each plan. In some embodiments, the divider 106 may utilize a compression algorithm, such as the Lempel-Ziv algorithm, to calculate the coding bit sizes.

For example, to calculate a coding bit size over a string S (which may comprise some or all of an interval $I_i$), a compressor of divider 106 may parse S into c unmatched symbols $S_i$ and d matched symbols $M_j$. The offset and length of a matched symbol $M_j$ may be $\Delta_j$ and $L_j$, respectively. $R_s(S_i)$ may denote the coding bits of an unmatched symbol $S_i$, and $R_m(M_i)$ may denote the coding bits of a match $M_i$. The total coding bits over S may then be defined as:

$$R(S) = \sum_{i=1}^{c} R_s(S_i) + \sum_{j=1}^{d} R_m(M_j)$$

In order to determine whether to encode a byte as a matched symbol or an unmatched symbol, divider 106 may compare a byte under consideration to the last byte in the same column. If the byte matches the last byte, it may be encoded as a matching symbol. If not, it may be encoded as an unmatched symbol.

Continuing with the above example, divider 106 may determine the coding bits for an unmatched symbol as being equal to one bit indicating whether or not the symbol is matched and log|A| bits representing the unmatched symbol, where A is an alphabet of possible values of the symbol. Thus, an unmatched symbol may be encoded without compression and represented by log|A| bits. Accordingly, the coding bits of an unmatched symbol $R_s(S_i)$ may be defined as:

$$R_s(S_i)=1+\log_2|A|$$

To encode a matched symbol $R_m(M_i)$, the divider 106 may determine the coding bits for an matched symbol as being equal to one bit indicating whether or not the symbol is matched and a number of bits representing the offset $\Delta_j$ and length $L_j$, of the matched symbol. The offset $\Delta_j$ may be represented by $2 \log_2(\Delta_j+1)-1$ bits, and the length $L_j$ may be represented by $2 \log_2(L_j+1)-1$ bits. Accordingly, the coding bits of a matched symbol $R_m(M_j)$ may be defined as:

$$R_m(M_j)=1+[2\log_2(\Delta_j+1)-1]+[2\log_2(L_j+1)-1]$$

After calculating the coding bit size of each string S, the divider 106 may sum the strings S for each interval $I_i$, and may sum the coding bit sizes $R(I_i)$ for each interval $I_i$ as:

$$R(P) = \sum_{i \in P} R(I_i)$$

to calculate the coding cost R(P) for a partition plan P.

In various embodiments, after calculating the coding cost R(P) for each partition plan P, the divider 106 may determine the optimal partition plan. In some embodiments, the optimal partition plan may be the partition plan having the smallest coding cost (i.e., smallest coding bit size). Accordingly, the divider 106 may attempt to determine an optimal partition plan P* such that $$R(P^*)=\text{Min}_P\{R(P)\}$$

To calculate the coding cost of the optimal partition P*, the divider 106 may utilize dynamic programming. For example, Q(i) may denote the coding cost of the optimal partition on the sub-table {C[0], . . . , C[i]}. Also, Q(−1)=0 and, for any i>=0, Q(i) can be calculated by recursive equation:

$$Q(i) = \min_{-1 \leq j < i}\{Q(j) + R(\{C[j+1], \ldots, C[i]\})\}$$

When Q(n−1) is calculated, the corresponding optimal partition plan P* is also known by tracking backwards the optimal path from Q(−1) to Q(n−1). Further, in one embodiment, the recursive equation Q(i) may be modified such that:

$$Q(i) = \min_{\mu \leq j < i}\{Q(i) + R(\{C[j+1], \ldots, C[i]\})\}$$

where μ=Max{−1, j−w}, and w is a pre-determined constant value. The modified recursive equation Q(i) may deliver results in a shorter amount of time, in some embodiments.

Exemplary operations of the contiguous interval divider 106 are shown in FIGS. 6 and 7 and described in greater detail below.

As is further shown in FIG. 1, the evaluator of reordering 108 may be any set of executable instructions to configure the one or more computing devices to evaluate the reordering plan to determine whether a reordered source file 114 would compress better than the original source file 102.

In various embodiments, the evaluator of reordering 108 (hereinafter "evaluator 108") may estimate compression rates of the byte sequences representing the source file 102 and reordered source file 114 using order-2 empirical entropy. The order-2 empirical entropy for each byte sequence may be defined as $$H = \sum_i \sum_j \sum_k p(x_i, y_j, z_k) \log_2 p(z_k \mid x_i, y_j)$$

where $z_k$ is a possible symbol in the sequence, $x_i$ and $y_j$ are the order-2 contexts of $z_k$, $p(z_k|x_i,y_j)$ is the conditional probability of $z_k$ given $x_i y_j$ as the order-2 contexts, and $p(x_i,y_j,z_k)$ is the joint probability of $x_i y_j z_k$. In one embodiment, if the order-2 empirical entropy of the reordered records is at least 10% lower than that of the raw records, the evaluator 108 may adopt the reordering plan and write the reordering plan into the reordering description file 114.

In various embodiments, the one or more computing devices may then reorder, block 112, the source file 102 to generate the reordered source file 114. As shown in FIG. 1, the reordering operation(s) may be based on the reordering description file 110. In various embodiment, the one or more computing devices may reorder the source file 102 by scanning column groupings of the file 102 separately, the groupings set forth in the reordering description file 110. In one embodiment, the scanning performed by the computing device may be raster scanning.

In some embodiments, the reordering description file 110 may be any sort of file known in the art, such as a plain text file or an XML file. The reordering description file 110 may include the reordering plan, the starting positions of the fixed-length records within the source file 102, record lengths of the fixed-length records, and a number of fixed-length records comprising a fixed-length table. Also, the reordering plan may comprise indications of the determined column groupings.

In various embodiments, the reordered file 114 may differ from source file 102 in that the column groupings of the fixed-length records may appear sequentially if scanned.

As illustrated, the reordering description file 110 and reordered file 114 may be compressed by a back-end compressor 116. In one embodiment, the compressor 116 may compress the files 110 and 114 into a Zip file format. The back-end compressor may then be, in such an embodiment, a Zip compression utility such as WinZip™ or GZip™. In other embodiments, compressor 116 may be any other sort of compression utility known in the art. And in some embodiments, the back-end compressor 116 may be any set of executable instructions to configure the one or more computing devices to perform operations which may compress the files 110 and 114.

Exemplary Operations

Figure 4:
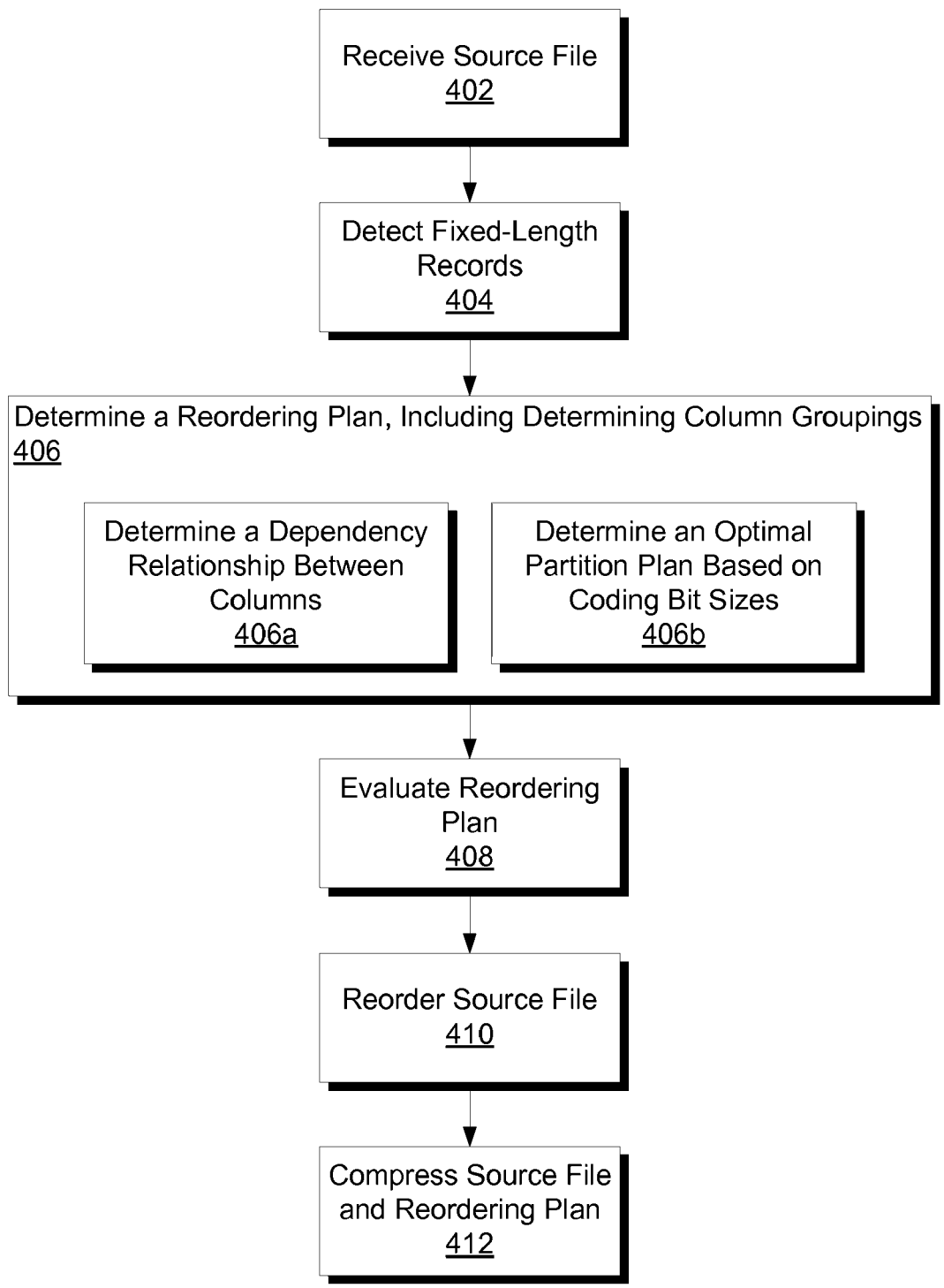
FIG. 4 is a flowchart view of exemplary operations associated with the overview shown in FIG. 1, in accordance with various embodiments.

FIG. 4 is a flowchart view of exemplary operations associated with the overview shown in FIG. 1, in accordance with various embodiments. As illustrated, one or more computing devices (such as the computing devices described above with reference to FIG. 1) may first receive or retrieve a source file, block 402.

After receiving/retrieving the source file, the computing devices may detect a plurality of fixed-length records within the source file, block 404. The detecting of block 404 is illustrated in FIG. 5 and described in greater detail herein.

As is shown in FIG. 4, the computing devices may then determine a reordering plan for the source file, including determining a plurality of column groupings within the detected fixed-length records, block 406. In some embodiments, the determining may include determining a dependency relationship between a first column and a second column based on a tendency of values repeating in the first column to appear together with values repeating in the second column, block 406a. The determining of block 406a is illustrated in FIG. 6 and described in greater detail herein.

In some embodiments, the determining may also or instead include determining a partition plan of a set of partition plans partitioning the fixed-length records into candidate column groupings as an optimal partition plan based on coding bit sizes associated with each partition plan, block 406b. The determining of block 406b is illustrated in FIG. 7 and described in greater detail herein.

In various embodiments, after determining the reordering plan and column groupings, the computing devices may evaluate the reordering plan to ensure that the source file will compress better after reordering than before reordering, block 408. Also, either while detecting, block 404, and determining, block 406, or after, the computing devices may create a reordering description file including the reordering plan, the reordering description file further including starting positions of the fixed-length records within the source file, record lengths of the fixed-length records, and a number of fixed-length records comprising a fixed-length table.

As shown in FIG. 4, the computing devices may then reorder the fixed-length records based on the reordering plan to facilitate compression of the source file, block 410. In some embodiments, the reordering may comprise raster scanning each column grouping separately.

In various embodiments, the computing devices may then compress the source file and the reordering description file, the column groupings and any non-record portions of the source file each compressed separately, block 412.

FIG. 5 is a flowchart view of exemplary operation association with detecting fixed-length records, in accordance with various embodiments. As illustrated, the computing devices may first determine a plurality of candidate records based on a repeating string pattern detected within the source file, block 502. After detecting the string pattern, the computing devices may determine a candidate record length based on a byte differential between repeated instances of the string pattern, block 504. In some embodiments, the computing devices may then calculate the threshold value by dividing the candidate record length by a pre-defined value ranging from 2 to 4, block 506. After calculating the threshold, the computing devices may compare first byte values occurring between the repeated instances of the string pattern with second byte values following the first byte values by the record length in order to calculate a score, block 508. The computing devices may then determine that the candidate records are members of the set of fixed-length records if the score is less than or equal to a threshold value, block 510. In some embodiments, the computing devices may next determine that the end of the set of fixed-length records has been reached if the score is larger than the threshold value, block 512. If the end of the records has not been reached, the computing devices may repeat the comparing and the determining that the candidate records are members until an end of the set of fixed-length records is reached.

FIG. 6 is a flowchart view of exemplary operation association with determining a dependency relationship between columns, in accordance with various embodiments. As illustrated, one or more computing devices may first calculate a probability that a repetition of values in the first column occurs together with a repetition of values in the second column, block 602. Then the computing devices may compare that probability to a threshold, block 604. In one embodiment, the threshold is set to 0.095. In some embodiments, if the probability is greater than the threshold, the computing devices may next determine that the dependency relationship exists between the first and second columns, block 606.

FIG. 7 is a flowchart view of exemplary operation association with determining an optimal partition plan, in accordance with various embodiments. As illustrated, one or more computing devices may first create a plurality of partition plans for detected fixed-length records, block 702. In one embodiment, the computing devices may create a partition plan for ever possible set of column groupings. Next, the computing devices may calculate the coding bit size for each partition plan using a Lempel-Ziv algorithm, block 704. Finally, the computing devices may determine the partition plan with the smallest coding bit size as the optimal partition plan, block 706.

Exemplary Computing Device

FIG. 8 illustrates an exemplary computing device 800 that may be configured to facilitate compression of a source file. For example, computing device 800 may be associated with a data center or search facility and may be used to implement some or all of the aspects of the claimed subject matter.

In a very basic configuration, computing device 800 may include at least one processing unit 802 and system memory 804. Depending on the exact configuration and type of computing device, system memory 804 may be volatile (such as RAM), non-volatile (such as ROM, flash memory, etc.) or some combination of the two. System memory 804 may include an operating system 805, one or more program modules 806, and may include program data 807. The operating system 805 may include a component-based framework 820 that supports components (including properties and events), objects, inheritance, polymorphism, reflection, and provides an object-oriented component-based application programming interface (API), such as that of the .NET™ Framework manufactured by Microsoft Corporation, Redmond, Wash. The device 800 may be of a configuration demarcated by a dashed line 808.

Computing device 800 may also have additional features or functionality. For example, computing device 800 may also include additional data storage devices (removable and/or non-removable) such as, for example, magnetic disks, optical disks, or tape. Such additional storage is illustrated in FIG. 8 by removable storage 809 and non-removable storage 810. Computer storage media may include volatile and nonvolatile, removable and non-removable media implemented in any method or technology for storage of information, such as computer readable instructions, data structures, program modules, or other data. System memory 804, removable storage 809 and non-removable storage 810 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 800. Any such computer storage media may be part of device 800. Computing device 800 may also have input device(s) 812 such as keyboard, mouse, pen, voice input device, touch input device, etc. Output device(s) 814 such as a display, speakers, printer, etc. may also be included. These devices are well know in the art and need not be discussed at length here.

Computing device 800 may also contain communication connections 816 that allow the device to communicate with other computing devices 818, such as over a network. Communication connections 816 are one example of communication media. Communication media may typically be embodied by computer readable instructions, data structures, program modules, etc.

Closing Notes

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

References are made in the detailed description to the accompanying drawings that are part of the disclosure and which illustrate embodiments. Other embodiments may be utilized and structural or logical changes may be made without departing from the scope of the disclosure. Therefore, the detailed description and accompanying drawings are not to be taken in a limiting sense, and the scope of embodiments is defined by the appended claims and equivalents.

Various operations may be described, herein, as multiple discrete operations in turn, in a manner that may be helpful in understanding embodiments; however, the order of description should not be construed to imply that these operations are order-dependent. Also, embodiments may have fewer operations than described. A description of multiple discrete operations should not be construed to imply that all operations are necessary.

The description may use perspective-based descriptions such as up/down, back/front, and top/bottom. Such descriptions are merely used to facilitate the discussion and are not intended to restrict the scope of embodiments.

The terms "coupled" and "connected," along with their derivatives, may be used herein. These terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

The description may use the phrases "in an embodiment," or "in embodiments," which may each refer to one or more of the same or different embodiments. Furthermore, the terms "comprising," "including," "having," and the like, as used with respect to embodiments, are synonymous.

For the purposes of the description, a phrase in the form "A/B" means A or B. For the purposes of the description, a phrase in the form "A and/or B" means "(A), (B), or (A and B)". For the purposes of the description, a phrase in the form "at least one of A, B, and C" means "(A), (B), (C), (A and B), (A and C), (B and C), or (A, B and C)". For the purposes of the description, a phrase in the form "(A)B" means "(B) or (AB)" that is, A is an optional element.

The invention claimed is:

1. A method comprising:
   detecting, by a computing device configured to facilitate compression of a source file, a plurality of fixed-length records within the source file;

determining, by the computing device, a reordering plan for the source file, including determining a plurality of column groupings within the detected fixed-length records; and reordering, by the computing device, the fixed-length records based on the reordering plan to facilitate compression of the source file.

2. The method of claim 1, wherein the further comprises:

determining a plurality of candidate records based on a repeating string pattern detected within the source file;

determining a candidate record length based on a byte differential between repeated instances of the string pattern;

comparing first byte values occurring between the repeated instances of the string pattern with second byte values following the first byte values by the record length in order to calculate a score; and if the score is less than or equal to a threshold value, determining that the candidate records are members of the set of fixed-length records.

3. The method of claim 1, wherein the determining the plurality of column groupings comprises determining a dependency relationship between a first column and a second column based on a tendency of values repeating in the first column to appear together with values repeating in the second column.

4. The method of claim 1, wherein the determining the plurality of column groupings comprises determining a partition plan of a set of partition plans partitioning the fixed-length records into candidate column groupings as an optimal partition plan based on coding bit sizes associated with each partition plan.

5. The method of claim 1, further comprising evaluating the reordering plan to ensure that the source file will compress better after reordering than before reordering.

6. The method of claim 5, wherein the evaluating comprises determining an order-2 empirical entropy for both the source file and the reordered source file, the order-2 empirical entropy defined as $$H = \sum_i \sum_j \sum_k p(x_i, y_j, z_k) \log_2 p(z_k | x_i, y_j)$$

wherein $z_k$ is a possible symbol in a file, $x_i$ and $y_j$ are the order-2 contexts of $z_k$, $p(z_k|x_i,y_j)$ is the conditional probability of $z_k$ given $x_i$ and $y_j$ as the order-2 contexts, and $p(x_i,y_j,z_k)$ is the joint probability of $x_i,y_j,z_k$.

7. The method of claim 1, further comprising creating a reordering description file including the reordering plan, the reordering description file further including starting positions of the fixed-length records within the source file, record lengths of the fixed-length records, and a number of fixed-length records comprising a fixed-length table.

8. The method of claim 1, wherein the reordering comprises raster scanning each column grouping separately.

9. The method of claim 1, further comprising compressing the source file and the reordering description file, the column groupings and any non-record portions of the source file each compressed separately.

10. A computing device comprising:

one or more processors; and programming instructions, stored on one or more computer storage media, configured to be executed by the one or more processors to detect a set of fixed-length records within a source file, including:

determining a plurality of candidate records based on a repeating string pattern detected within the source file;

determining a candidate record length based on a byte differential between repeated instances of the string pattern;

comparing first byte values occurring between the repeated instances of the string pattern with second byte values following the first byte values by the record length in order to calculate a score; and if the score is less than or equal to a threshold value, determining that the candidate records are members of the set of fixed-length records.

11. The computing device of claim 10, wherein the score is calculated using a function defined as:

$$CalMatch(q_1, q_2, l) = \sum_{i=0}^{l-1} s_i$$

where $$s_i = \begin{cases} 0 & \text{if } q_1[i] = q_2[i] \\ 1 & \text{otherwise} \end{cases}$$

wherein $q_1$ and $q_2$ are start positions of two fixed-length records and l is a candidate record length.

12. The computing device of claim 10, wherein the instructions are further configured to be executed by the processor to repeat the comparing and the determining that the candidate records are members until an end of the set of fixed-length records is reached.

13. The computing device of claim 12, wherein the instructions are further configured to be executed by the processor to determine that the end of the set of fixed-length records has been reached if the score is larger than the threshold value.

14. The computing device of claim 10, wherein the instructions are further configured to be executed by the processor to calculate the threshold value by dividing the candidate record length by a pre-defined value ranging from 2 to 4.

15. An article of manufacture comprising:

one or more computer storage media; and a plurality of programming instructions stored on the one or more computer storage media and configured to program a computing device to, when executed, perform operations comprising:

detecting one or more fixed-length records within a source file, the detecting including:

determining a plurality of candidate records based on a repeating string pattern detected within the source file;

determining a candidate record length based on a byte differential between repeated instances of the string pattern;

comparing first byte values occurring between the repeated instances of the string pattern with second byte values following the first byte values by the record length in order to calculate a score; and if the score is less than or equal to a threshold value, determining that the candidate records are members of the set of fixed-length records;

determining a plurality of column groupings within the fixed-length records, the determining including:

determining a dependency relationship between a first column and a second column based on a tendency of values repeating in the first column to appear together with values repeating in the second column, or determining a partition plan of a set of partition plans partitioning the fixed-length records into candidate column groupings as an optimal partition plan based on coding bit sizes associated with each partition plan; and reordering the fixed-length records based on the plurality of column groupings to facilitate compression of the source file.

16. The article of claim 15, wherein the determining the dependency relationship includes:

calculating a probability that a repetition of values in the first column occurs together with a repetition of values in the second column;

comparing that probability to a threshold; and if the probability is greater than the threshold, determine that the dependency relationship exists between the first and second columns.

17. The article of claim 16, wherein the threshold is set to 0.95.

18. The article of claim 16, wherein the operations further comprise calculating the coding bit size for each partition plan using a Lempel-Ziv algorithm.

19. The article of claim 18, wherein the Lempel-Ziv algorithm calculates a total number of coding bits over a string using a function R(S), where $$R(S) = \sum_{i=1}^{c} R_s(S_i) + \sum_{j=1}^{d} R_m(M_j)$$

wherein S represents the string, $S_i$ represents an unmatched symbol, c is the number of unmatched symbols, $M_j$ represents a matched symbol, d is the number of matched symbols, $R_s(S_i)$ denotes the number of coding bits of an unmatched symbol $S_i$, and $R_m(M_j)$ denotes the number of coding bits of a matched symbol $M_j$, wherein $R_s(S_i)$ is further defined as $$R_s(S_i) = 1 + \log_2|A|$$

wherein $\log_2|A|$ represents the number of coding bits of an unmatched symbol $S_i$, and wherein $R_m(M_j)$ is further defined as $$R_m(M_j) = 1 + [2\log_2(\Delta_j+1)-1] + [2\log_2(L_j+1)-1]$$

wherein $\Delta_j$ represents an offset of a matched symbol $M_j$ and $L_j$ represents a length of a matched symbol $M_j$.

20. The article of claim 18, wherein the partition plan is determined as the optimal partition plan by comparing the coding bit sizes of the partition plans utilizing a function Q(i), where $$Q(i) = \min_{-1 \leq j < i}\{Q(j) + R(\{C[j+1], \ldots, C[i]\})\}$$

or $$Q(i) = \min_{\mu \leq j < i}\{Q(i) + R(\{C[j+1], \ldots, C[i]\})\}$$

wherein Q(i) denotes the coding bit size of the optimal partition plan on a sub-table {C[0], ..., C[i]}.

* * * * *